United States Patent [19]

Moriya et al.

[11] 4,297,676

[45] Oct. 27, 1981

[54] MARK SIGNAL AMPLIFIER

[75] Inventors: Shigeru Moriya, Hoya; Nobuo Hamamto; Kazuo Ichino, both of Tokyo; Kanji Ozawa, Akishima, all of Japan

[73] Assignee: Hitachi, Ltd., Tokyo, Japan

[21] Appl. No.: 107,087

[22] Filed: Dec. 26, 1979

[30] Foreign Application Priority Data

Dec. 22, 1978 [JP] Japan ............... 53-157417

[51] Int. Cl.³ ............................... G06K 9/32
[52] U.S. Cl. ..................... 340/146.3 AG; 307/351; 340/146.3 H; 364/490
[58] Field of Search ............... 328/115; 250/561; 340/146.3 AG, 146.3 H; 307/351; 364/488, 489, 490, 491, 515; 356/375, 394

[56] References Cited

U.S. PATENT DOCUMENTS

| | | | |
|---|---|---|---|
| 3,159,815 | 12/1964 | Groce | 340/146.3 AG |
| 3,225,213 | 12/1965 | Hinrichs et al. | 340/146.3 AG |
| 3,415,950 | 12/1968 | Bartz et al. | 340/146.3 AG |
| 3,599,148 | 4/1969 | Stern | 340/146.3 AG |
| 3,599,151 | 8/1971 | Harr | 340/146.3 AG |
| 3,869,698 | 3/1975 | Trost et al. | 340/146.3 AG |
| 3,909,594 | 9/1975 | Allais et al. | 340/146.3 AG |

*Primary Examiner*—Leo H. Boudreau
*Attorney, Agent, or Firm*—Craig and Antonelli

[57] ABSTRACT

In electron-beam lithography, and similar operations, to achieve good drawing accuracy on a sample, it is necessary to detect the position of a mark on the sample with high accuracy. To accomplish this, a mark signal amplifier is provided including a first circuit for taking maximum and minimum values out of a mark signal detected by causing an electron beam to scan a mark area provided on a sample. A second circuit determines a peak-to-peak value of an amplitude of the detected mark signal in accordance with the maximum and minimum values, and a third circuit produces an output signal of a constant amplitude level as an input to a binary-coding circuit in accordance with the peak-to-peak value. The output signal of the third circuit remains constant in spite of fluctuations of the detected mark signal, so that a higher accuracy is obtained in detecting the mark for positioning. An alternative arrangement adds the maximum and minimum values, and establishes a mean value of the maximum and minimum values from the resultant sum.

7 Claims, 5 Drawing Figures

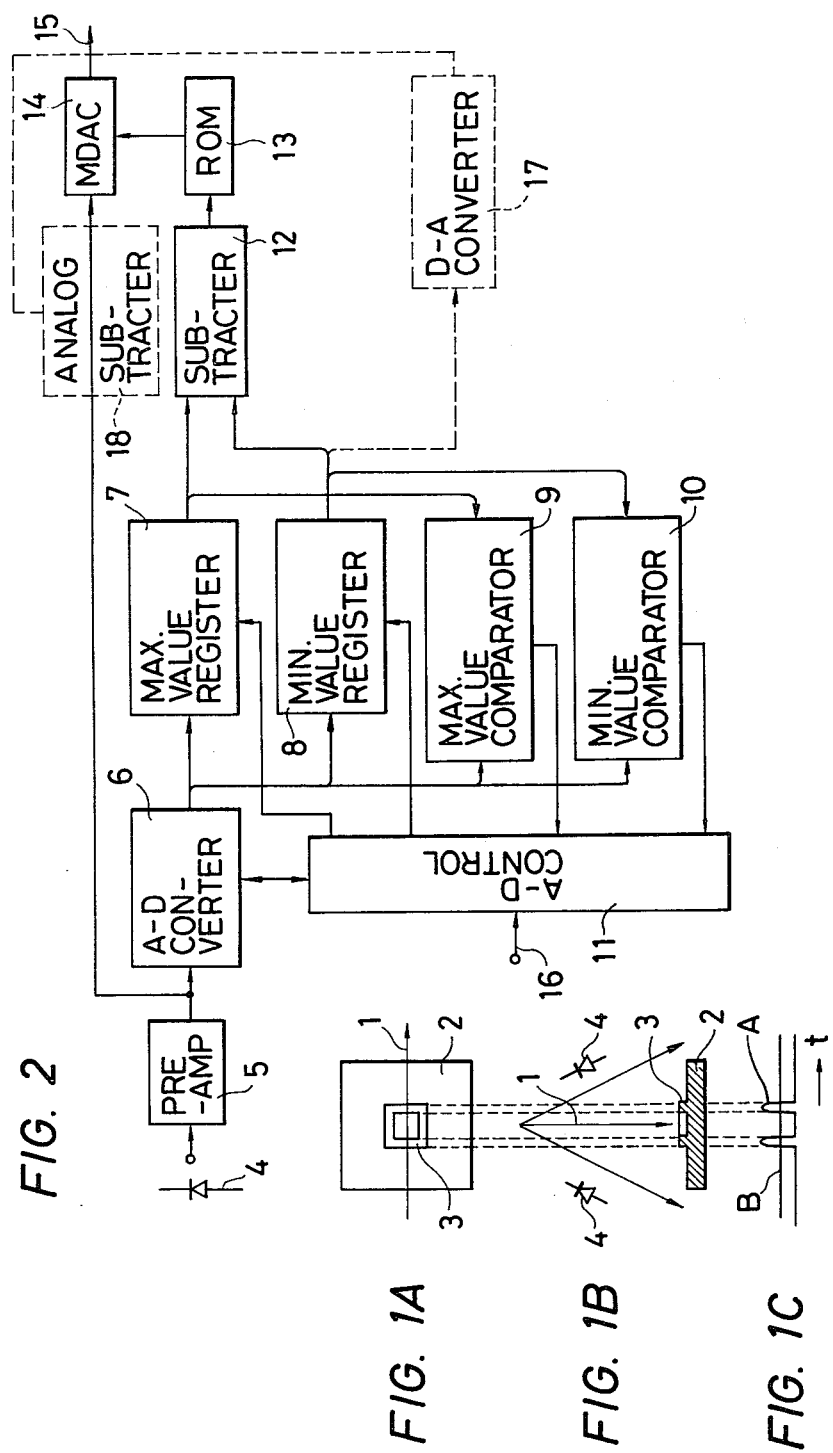

MARK SIGNAL AMPLIFIER

BACKGROUND OF THE INVENTION

This invention relates to a mark signal amplifier which is used in an apparatus for electron-beam lithography and similar operations in order to detect with high accuracy the position of a mark for positioning which has been applied on the surface of a sample.

Devices for electron-beam lithography generally include a mark detecting circuit for positioning a sample (mask or wafer) and for measuring, for example, the drift and deflecting distortion of a beam deflection system. This circuit performs a very important function of making various corrections on the basis of an output signal obtained in such a manner that a mark called a "reference mark" is placed at a specified position on an X-Y stage or that a mark is applied on the sample itself, aand that the mark is scanned with an electron beam. It can be easily conjectured that the accuracy of mark detection therefore has a direct influence on the drawing accuracy itself.

Referring to FIGS. 1A, 1B and 1C, when a mark 3 (for example, a mark of evaporated Au or a mark of a step or a recess in Si) on a silicon (Si) substrate 2 is scanned by an electron beam 1, a mark detection signal A based on reflected electrons is obtained in a solid-state detector 4. This signal is subjected to a binary-coding process with a threshold signal B, and is thus turned into a pulse.

Accordingly, the mark position can be known by precisely detecting the period of time from the initiation of the scanning to the time of obtaining the pulse signal. More specifically, letting v (m/sec) denote the scanning speed of the beam and t (sec) the period of time until the binary-coded pulse is obtained, the mark position is determined as a distance v.t (m) from the starting point of the scanning. In order to find the centroid of the mark more precisely, the period of time is obtained as $t=(t_1+t_2+t_3+t_4)/4$ where $t_1$ and $t_2$ denote time intervals taken for the leading edge and trailing edge, respectively, of a first pulsed signal, and $t_3$ and $t_4$ denote those corresponding to a pulsed signal appearing next.

In order to ensure this operation, the level of the threshold signal B must be exactly ½ of that of the reflected electron signal A obtained in the solid-state detector 4 when the mark is being scanned. Moreover, the signal level of the reflected electron signal A during mark scanning varies greatly depending upon the magnitude of an electron beam current, the mounting position of the sensor, the deterioration of the sensor, the contamination of the mark itself, the shape of the mark, etc. Therefore, it is extremely difficult in practice to adjust the level of the threshold signal in many cases. Further, such adjusting results in a loss in time in the drawing, requires a high degree of skill, and cannot realize a delicate adjustment of high accuracy.

SUMMARY OF THE INVENTION

This invention has been made in view of the above-described difficulties, and has for its object to provide a mark signal amplifier for detecting the position of a positioning mark with high accuracy.

In order to accomplish this and other objects, according to this invention, a reflected electron signal is first amplified by an amplifier to maintain a constant amplitude level for a signal to be supplied to a binary-coding circuit, thereby enhancing the mark detecting accuracy. As an expedient for making the amplitude level of the signal constant, at a stage preceding to the due detection of a mark position, a minute area where the mark exists (i.e. the mark area) is scanned to determine the amplitude value of the signal obtained from a solid-state detector. Then the gain coefficient of the amplifier is set by referring to reference values stored in a storage device in advance. The stored reference values correspond to the gain coefficients for the amplifier which are necessary to achieve a constant amplifier output for supplying to the binary-coding circuit.

BRIEF DESCRIPTION OF THE DRAWINGS

FIGS. 1A and 1B are a plan view and a sectional view of a mark area, respectively, and FIG. 1C is a diagram showing a detection output signal obtained by scanning the mark area;

FIG. 2 is a circuit diagram showing an embodiment of this invention; and

DETAILED DESCRIPTION OF THE PREFERRED EMBODIMENTS

Figure 3:
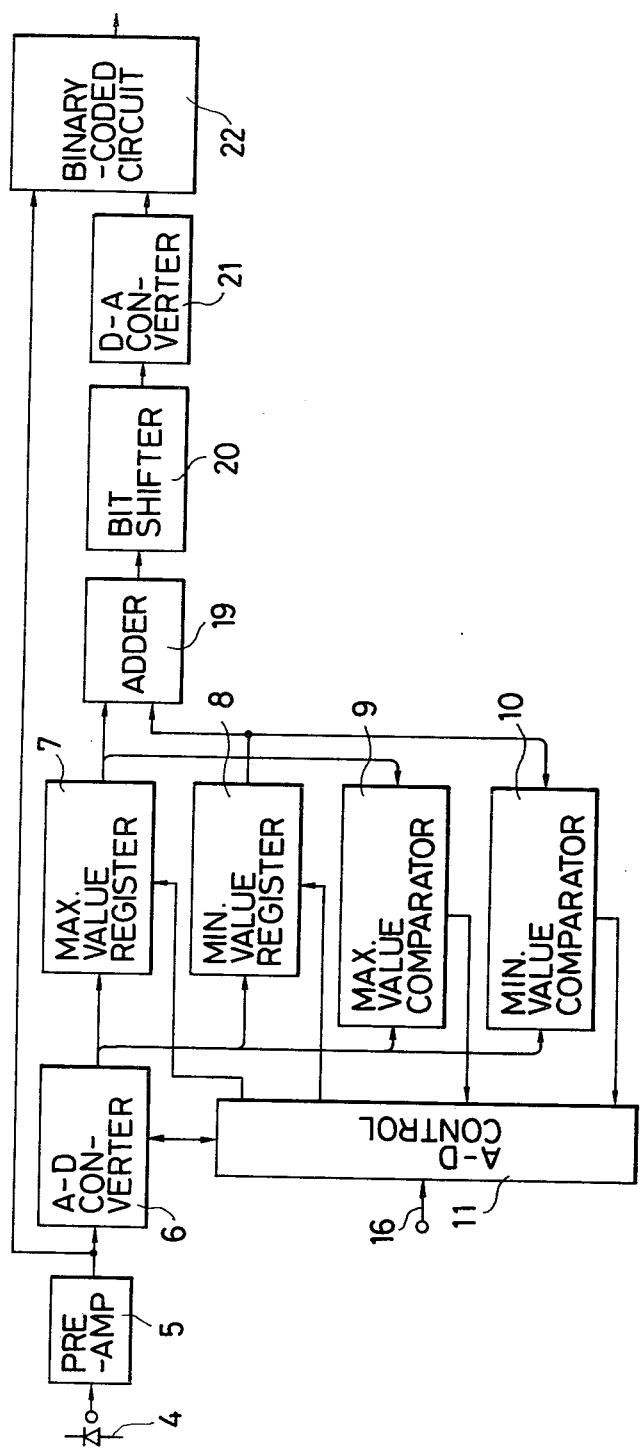
FIG. 3 is a circuit diagram showing another embodiment of this invention.

Referring now to the drawings, and particularly to FIG. 2, a first embodiment of the invention is shown wherein an output signal from a solid-state detector 4 is amplified to a proper amplitude level by passing it through a pre-amplifier 5. The amplified signal is applied to the input of a high speed analog-to-digital converter 6.

In another portion of the circuit of FIG. 2, when a mark area scanning signal 16 is applied to an analog-to-digital control circuit 11 to indicate the the mark area where the mark is located is presently being scanned, both a maximum value register 7 and a minimum value register 8 are reset. A-D start signals are then successively fed to the analog-to-digital converter 6 from the analog-to-digital control circuit 11 until the mark area scanning signal 16 is thereafter released. However, each successive A-D start signal is delivered only when an A-D conversion end signal is provided to the analog-to-digital control circuit 11 from the analog-to-digital converter 6.

At the time when an A-D conversion has ended in the converter 6, output values during the A-D conversion are respectively compared with the contents of the maximum value register 7 and the minimum value register 8 by a maximum value comparator 9 and a minimum value comparator 10. The contents of the respective registers are then renewed through the analog-to-digital control circuit 11.

More specifically, when [content of the A-D conversion]>[content of the maximum value register], the content of the maximum value register is rewritten each time and then held as a peak value in the positive direction. The same applies to the minimum value, and each time [content of the A-D conversion]<[content of the minimum value register], the content of the minimum value register is rewritten to renew a peak value in the negative direction. Accordingly, at the time when the mark area scanning signal 16 has been released, the maximum value and the minimum value of the signal in a mark area are respectively obtained in the maximum value register 7 and the minimum value register 8.

The contents of both these registers 7 and 8 are subjected to the operation of [maximum value - minimum value] by means of a subtracter 12 so as to obtain the peak-to-peak value of the amplitude, which is applied as address information for a read only memory ROM 13. The ROM 13 stores data, to be described later, in correspondence with the respective amplitudes (i.e. the address information) from the subtracter 12. The output of ROM 13 is applied to the digital input terminal of a multiplying digital-to-analog converter MDAC 14 as a weight coefficient.

On the other hand, the analog information from the preamplifier 5 is applied to the analog input terminal of the MDAC 14. It is multiplied in the MDAC 14 by the aforecited digital information, and the resultant product becomes an input signal 15 to a binary-coding circuit.

Now, letting $E_{ip-p}$ denote the peak-to-peak voltage of the amplitude obtained by the mark area scanning described above, $E_i$ denote an input voltage in a due mark detection to be consecutively performed (input voltage of the analog-to-digital converter) and $E_o$ denote the output voltage of the MDAC, there is required a control wherein $E_o = k \cdot E_i =$ constant. That is, a control is desired wherein the output voltage $E_o$ is made constant even when the input voltage $E_i$ changes. To this end, the relation of $k \propto 1/E_{ip-p}$ must be held. Therefore, values of this quantity k are set and stored in the ROM 13 in advance. Thus, the ROM 13 effects a division function.

By adding such a circuit arrangement as described above, a voltage $E_o$ which is constant during mark scanning in obtained as the signal 15. Once the threshold level B of the binary-coding circuit has been set so as to become ½ of the output signal $E_o$ of the MDAC 14, subsequent adjustment is not necessary even when the beam current is changed. Accordingly, the operating efficiency is remarkably improved, and the enhancement of the mark detecting accuracy can be achieved.

This improvement can even be realized in a case where the input signal is superposed on direct current. In such a case, the content of the minimum value register 8 is converted into an analog voltage by means of a digital-to-analog converter 17, and this signal is subjected to a subtraction process in an analog subtracter 18 with respect to the input signal before entering the MDAC 14. In this way, the d.c. component is removed and the remaining signal is applied to the MDAC 14, whereby the output amplitude level of the MDAC 14 can be held constant.

In the foregoing embodiment, in a case where, in view of the sensitivity of the binary-coding circuit, the signal 15 for the binary-coding circuit is difficult to convert into pulses at high precision with the output value thereof, better results are achieved by disposing an amplifier at a stage succeeding to the MDAC 14.

Another embodiment of this invention will now be described. As an alternative method for accomplishing the objects of this invention stated previously, it is also possible to store the amplitude values of the signal obtained by scanning the mark area immediately before the due mark detection as in the foregoing embodiment and to execute the binary-coding by employing ½ of the levels of the signal values as a threshold value.

More specifically, as shown in FIG. 3, the maximum value and minimum value of the amplitude of the signal obtained by scanning the mark area immediately before the due mark detection are respectively stored in the maximum value register 7 and the minimum value register 8, and both these values are added by means of an adder 19. Thereafter, the resultant sum is passed through a bit shifter circuit 20 adapted to shift its input rightwards by 1 bit, to thus make the content ½. This operation is equivalent to obtaining the mean value of the maximum and minimum values of the input signal. This means value is converted into an analog voltage by a digital-to-analog converter 21, and the analog voltage is compared by a binary-coding circuit 22 with a signal obtained at the due mark detection scanning Thus, the edge part of the mark is precisely caught and turned into a pulse. Since, in this embodiment, the structure and operation up to the point of obtaining the maximum and minimum values of the signal based on the mark area scanning is the same as in the first embodiment described previously, reference numerals 4 to 11 and 16 in FIG. 3 indicate the same constituents as in the case of FIG. 2.

The second embodiment shown in FIG. 3 has the advantage that even when a d.c. component is superposed on the input signal, the additional processing for removing the d.c. component described for the foregoing first embodiment is unnecessary becaause the threshold level is evaluated on the basis of the maximum and minimum values of the input voltage at ½ of the input amplitude values.

As set forth above, according to this invention, the amplitude level of a signal to be supplied to a binary-coding circuit is made constant at all times, or, alternatively, the amplitude values of a signal are stored and the level of ½ of the signal values is made a threshold value, thereby to permit a mark position detection at a high accuracy which has previously been unattainable.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A mark signal amplifier comprising:
    first means for obtaining the maximum and minimum values of a mark signal from a detector as detected by scanning an electron beam over a mark area formed on a sample;
    second means for obtaining a peak-to-peak value of an amplitude of the detected mark signal from said maximum and minimum values; and
    third means for supplying an output signal of a constant amplitude in accordance with said peak-to-peak value of said amplitude independently of fluctuations in said detected mark signal,
    wherein said first means comprises means for amplifying said detected mark signal, an analog-to-digital converter for converting said detected mark signal to a digital signal, comparators for comparing the output digital signals from said analog-to-digital converter with the contents of a maximum value register for storing the maximum value of said detected mark signal and with the contents of a minimum value register for storing the minimum value of said detected mark signal, and means to renew the respective contents of the maximum and minimum value registers in accordance with the comparators outputs, whereby said maximum and minimum values of said detected mark signal are obtained.

2. A mark signal amplifier as defined in claim 1, wherein said means for renewing operates such that each time the content of said analog-to-digital converter is greater than the content of said maximum value register, said content of said maximum value register is rewritten to renew a peak value in a positive direction, and each time the content of said analog-to-digital converter is less than the content of said minimum value register, said content of said minimum value register is rewritten to renew a peak value in a negative direction, whereby said maximum and minimum values are obtained.

3. A mark signal amplifier as defined in claim 2, wherein said second means comprises a subtracter.

4. A mark signal amplifier as defined in claim 1 or 3, wherein said third means comprises a read only memory in which preset reference values are stored in correspondence with the peak-to-peak values of said amplitude, and a multiplying digital-to-analog converter which multiplies a digital output of said read only memory and said detected mark signal as amplified in said first means, to supply said output signal of said constant amplitude level.

5. A mark signal amplifier as defined in claim 4, further including means for subjecting the content of said minimum value register to digital-to-analog conversion and thereafter subjecting the analog signal to subtraction with respect to said detected mark signal amplified in said first means, to apply the difference signal to said multiplying digital-to-analog converter.

6. A mark signal amplifier comprising:
   first means for obtaining the maximum and minimum values of a mark signal from a detector as detected by scanning an electron beam over a mark area on a sample;
   second means for adding the maximum and minimum values of the mark signal; and
   third means for obtaining the means value of the maximum and minimum values of the mark signal and providing this mean value as the amplifier output signal,
   wherein said first means comprises means for amplifying said detected mark signal, an analog-to-digital converter for converting said detected mark signal to a digital signal, comparators for comparing the output digital signals from said analog-to-digital converter with the contents of a maximum value register for storing the maximum value of said detected mark signal and with the contents of a minimum value register for storing the minimum value of said detected mark signal, and means to renew the respective contents of the maximum and minimum value registers in accordance with the comparators outputs, whereby said maximum and minimum values of said detected mark signal are obtained.

7. A mark signal amplifier as defined in claim 6, wherein the third means includes a bit shifter for shifting the output of the second means for adding by one bit to obtain the mean value of the maximum and minimum values.

* * * * *